United States Patent [19]

Drefahl

[11] Patent Number: 4,809,355

[45] Date of Patent: Feb. 28, 1989

[54] METHOD FOR OPERATING A TRANSMITTING/RECEIVING CIRCUIT AND AN APPARATUS FOR IMPLEMENTING THE METHOD

[75] Inventor: Dieter Drefahl, Hanau, Fed. Rep. of Germany

[73] Assignee: Honeywell Regelsysteme GmbH, Fed. Rep. of Germany

[21] Appl. No.: 939,331

[22] Filed: Dec. 8, 1986

[30] Foreign Application Priority Data

Dec. 20, 1985 [EP] European Pat. Off. ........ 85116347.7

[51] Int. Cl.$^4$ .......................... H04B 1/38; H04B 1/54
[52] U.S. Cl. ....................................... 455/75; 455/73; 455/84; 455/86; 455/87
[58] Field of Search .................................... 455/73–76, 455/78, 79, 84, 86, 87; 367/903

[56] References Cited

U.S. PATENT DOCUMENTS

| | | | |
|---|---|---|---|
| 2,846,572 | 8/1958 | Elliott | 455/75 |
| 3,117,241 | 1/1964 | Paynter et al. | 367/903 |
| 4,095,183 | 6/1978 | Kakigi | 455/78 |
| 4,254,504 | 3/1981 | Lewis et al. | 455/76 |

Primary Examiner—Michael A. Masinick
Attorney, Agent, or Firm—Mitchell J. Halista; Albin Medved

[57] ABSTRACT

A method for operating a transmitting/receiving circuit for ultrasonic signals includes the steps of producing a carrier frequency by a voltage-controlled oscillator having an output frequency controlled in accordance with a temperature dependency of an inherent frequency of the transducer, modulating the carrier frequency, applying the modulated carrier frequency in a transmitting mode to energize an ultrasonic transducer to produce ultrasonic transmission signals, switching from the transmitting mode to a receiving mode, applying output signals from the transducer representative of received ultrasonic signals to a phase-locked-loop circuit using the voltage-controlled oscillator whereby the phase-lock-loop circuit is automatically matched to a frequency of the received signals. An apparatus utilizing this method includes a transmitting/receiving transducer, a phase-locked-loop having a voltage-controlled oscillator, a modulator for applying a modulated carrier frequency to the transducer in a transmitting mode, a transmitting circuit for selectively applying an output from the oscillator as a carrier frequency to the modulator to produce the modulated carrier frequency, a receiving circuit for selectively applying an output from the transducer in a receiving mode for receiving reflected signals to an input of the phase-locked-loop and a temperature responsive element arranged to control the voltage-controlled oscillator at a frequency matched to an inherent frequency of the transducer.

6 Claims, 2 Drawing Sheets

METHOD FOR OPERATING A TRANSMITTING/RECEIVING CIRCUIT AND AN APPARATUS FOR IMPLEMENTING THE METHOD

BACKGROUND OF THE INVENTION

1. Field of the Invention

The present invention relates to a method for operating a transmitting/receiving circuit as well as to a device for implementing the method. More specifically, the present invention is directed to a method and apparatus for receiving a reflected ultrasonic signal free from interferences.

2. Description of the Prior Art

It is known to modulate a relatively high frequency matched to the inherent frequency of an ultrasonic transducer according to an arbitrary modulation method and to radiate the frequency after amplification by the ultrasonic transducer. The ultrasonic echo reflected from an object to be evaluated may be received by the same transducer and can be evaluated after an amplification. Commonly the elapsed time between the transmitted and received signal is measured, whereat the signal detection may be done on the rising or trailing edge of the modulated signal.

With a frequency selective device, as for instance a narrow band filter within the receiving circuit, freedom of interferences with respect to the received signal may be importantly increased. Air-coupled sonic transducers have a relatively high functional relationship of temperature with respect to their inherent frequency. Because of this functional relationship of temperature of the frequency radiated by the transducer the selective frequency of the filter has to follow the transmitted frequency. This may be done in a manner as it is shown and described in the prior art wherein the frequency of a voltage-controlled oscillator within a phase-locked loop is readjusted, i.e., a larger frequency range is passed through, in which range the received frequency is located anywhere so that at reaching of the pull-in range, the phase-locking loop is locked.

SUMMARY OF THE INVENTION

It is the object of the present invention to provide an improved method for transmitting and receiving an ultrasonic signal in such a way that an automatic frequency control at the receiving side of an ultrasonic echo is not necessary.

Another object of the present invention is to provide an improved apparatus for implementing the aforesaid improved method.

In accomplishing these and other objects, there has been provided, in accordance with the present invention, an improved method for operating a transmitting/receiving circuit including the steps of producing a carrier frequency by a voltage-controlled oscillator having an output frequency controlled in accordance with a temperature dependency of an inherent frequency of the transducer, modulating the carrier frequency, applying the modulated carrier frequency in a transmitting mode to energize an ultrasonic transducer to produce ultrasonic transmission signals, switching from the transmitting mode to a receiving mode, applying output signals from the transducer representative of received ultrasonic signals to a phase-locked-loop circuit using the voltage-controlled oscillator whereby the phase-lock-loop circuit is automatically matched to a frequency of the received signals. An apparatus utilizing this method includes a transmitting/receiving transducer, a phase-locked-loop having a voltage-controlled oscillator, a modulator for applying a modulated carrier frequency to the transducer in a transmitting mode, a transmitting circuit for selectively applying an output from the oscillator as a carrier frequency to the modulator to produce the modulated carrier frequency, a receiving circuit for selectively applying an output from the transducer in a receiving mode for receiving reflected signals to an input of the phase-locked-loop and a temperature responsive element arranged to control the voltage-controlled oscillator at a frequency matched to an inherent frequency of the transducer.

BRIEF DESCRIPTION OF THE DRAWINGS

A better understanding of the present invention may be had when the following description is read in connection with the accompanying drawings, in which.

DESCRIPTION OF THE PREFERRED EMBODIMENT

Figure 1:
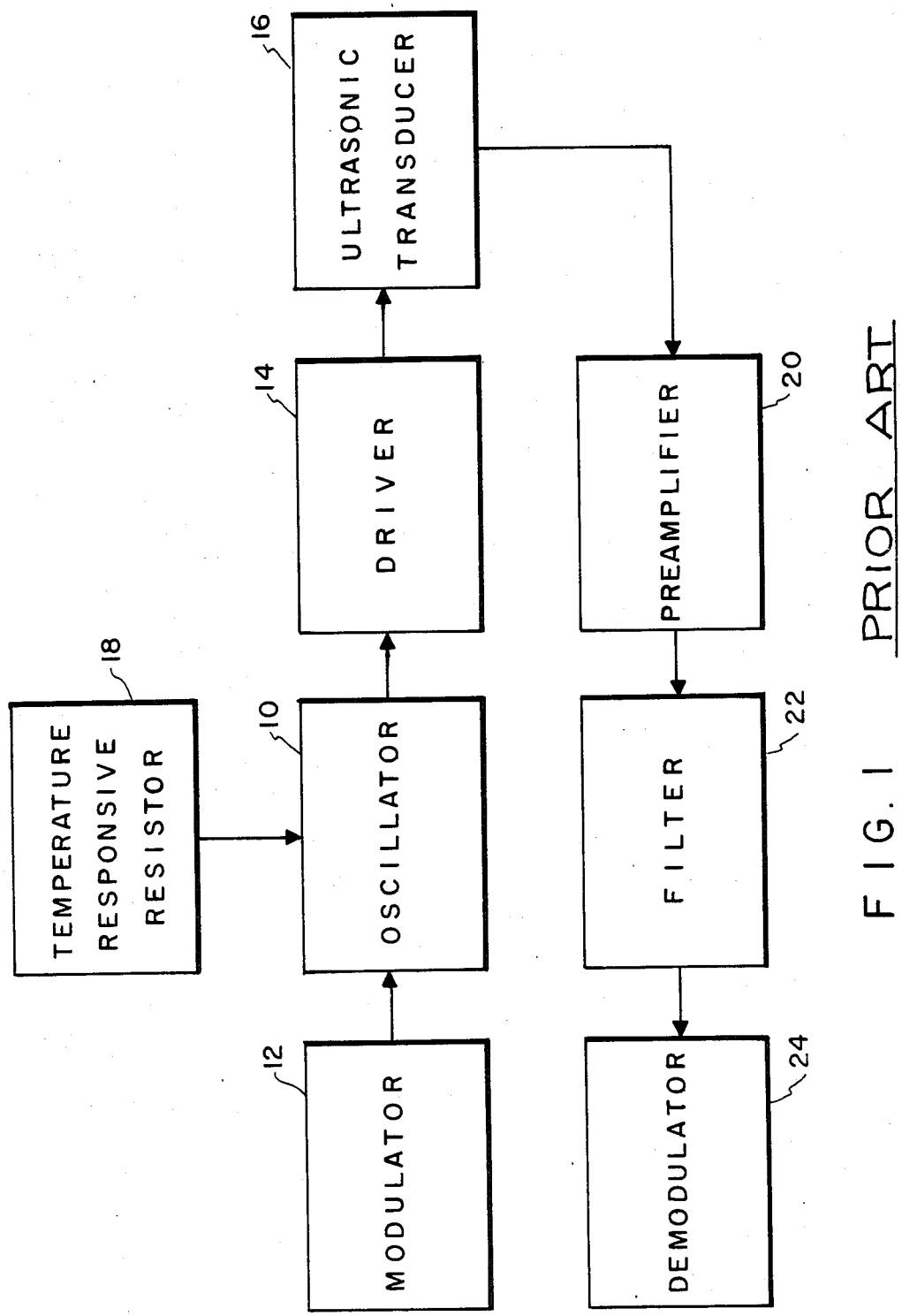
FIG. 1 is a block diagram of a prior art transmitting/receiving circuit.

Referring to FIG. 1, a carrier frequency provided by an oscillator 10 is modulated by a modulator 12. In the simplest case, the modulator 12 switches on and off the carrier frequency which results in an amplitude modulation having a modulation factor between 100% and 0%. The modulated carrier frequency controls via a transmitter driver 14 an ultrasonic transducer 16. Since the inherent frequency of the ultrasonic transducer 16 is strongly depending on temperature, the oscillator 10 producing the carrier frequency may be implemented as a voltage controlled oscillator (VCO) with the frequency of said oscillator being controlled for instance by means of a temperature responsive resistor 18 (NTC).

An echo signal received by the same ultrasonic transducer 16 or by a further transducer, respectively, is fed to a frequency selective device as for instance a filter 22 via a preamplifier 20, whereat the center frequency of the filter 22 is matched to the carrier frequency. The filtered signal after an according demodulation may be evaluated in a device 24, whereat triggering may be done on the rising or trailing edge of the envelope and the elapsed time between the transmitted and received signal is measured. Evaluation also may be done according to the method as previously described. In each event the center frequency of the filter has to be readjusted to the changing carrier frequency in order to evaluate the received signal. In the use of a phase-locking loop (PLL) as a frequency-selective device this may be done by readjusting the frequency of the voltage controlled oscillator (VCO) included in the phase-locking loop. Such readjusting does not means that the frequency of the voltage controlled oscillator is adjusted as a function of the temperature but means that a large frequency range is passed through in which range the received frequency is located so that at reaching of the pull-in range of the phase-locking loop this loop is locked. If, for instance, triggering is intended on the rising edge of the reflected echo signal, no time is available with the known method to pass through the frequency range.

Figure 2:
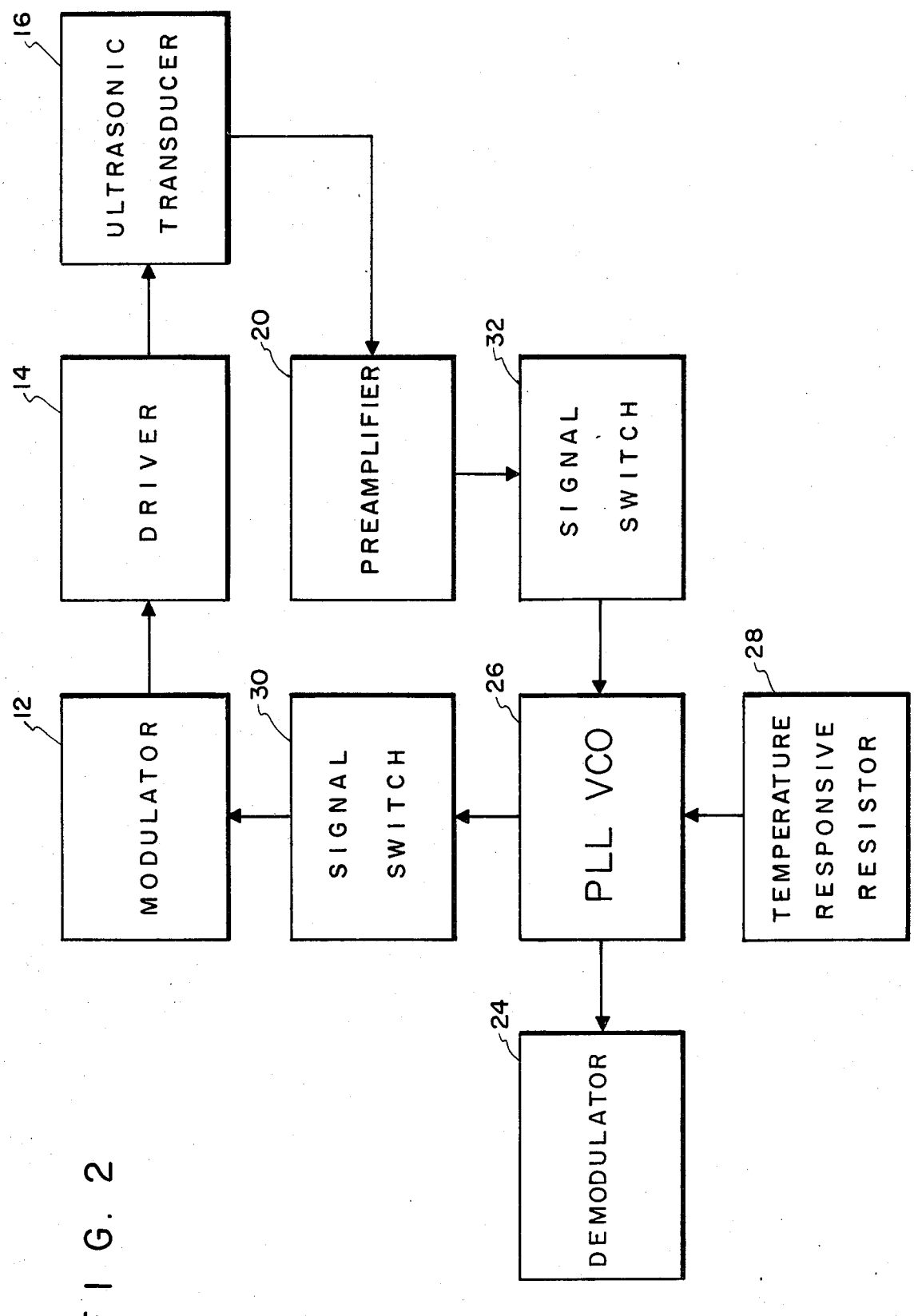
FIG. 2 is a block diagram of a transmitting/receiving circuit embodying an example of the present invention.

With the circuit device of the present invention, according to FIG. 2, frequency adjusting is not necessary so that no limitations are given with respect to signal evaluation. As shown in FIG. 2, a frequency selective device 26, in particular a phase-locked loop (PLL), comprises a voltage controlled oscillator (VCO), the frequency of which is adjusted as a function of temperature by means of a NTC resistor 28. Herewith the NTS resistor 28 is chosen in such a way that its temperature behavior is matched to the change of the inherent frequency of the ultrasonic transducer 16. The frequency of the voltage-controlled oscillator now is used as a carrier frequency for the signal to be transmitted with the signal being fed to the modulator 12 via a first switch 30 which, for instance, is switching on and off the carrier frequency. The ultrasonic transducer 16 then it fed by the modulated carrier frequency via the transmitter driver 14 so that an ultrasonic signal having a corresponding frequency is radiated.

After radiation of the modulated carrier frequency signal by means of the ultrasonic transducer 16 the switch 30 is opened, and a second switch 32 in the receiving branch of the frequency-selective device 26 is closed so that in receiving a reflected echo signal this received signal is fed to the frequency selective device 26 after preamplification in the preamplifier 20. With the use of phase-locking loop which always includes a voltage-controlled oscillator the received carrier frequency now is automatically matched to the pull-in range of the phase-locking loop. If the phase-locking loop is implemented as a sound decoder which binarily changes its output signal and if a signal of the right frequency and of sufficient amplitude is received, the initial response (rising edge triggering) the end of the response (trailing edge triggering) or the period of response (phase comparison) may be evaluated for measuring the elapsed time. Since in the chosen circuit device the center frequency of the frequency-selective device 26 (PLL or sound decoder, respectively) is forcibly synchronizing the transmitting frequency, the ideal condition of an extremely steep filter (pull-in range of the PLL) results having a very low bandwidth, for instance, smaller than one percent.

Accordingly, it may be seen that there has been provided, in accordance with the present invention, an improved method and apparatus for transmitting-/receiving an ultrasonic signal.

The embodiments of the present invention in which an exclusive property or privilege is claimed are defined as follows:

1. A transmitting/receiving circuit comprising
    a transmitting/receiving transducer,
    a phase-locked-loop having a voltage-controlled oscillator,
    a modulator for applying a modulated carrier frequency to said transducer in a transmitting mode,
    a transmitting circuit for selectively applying an output from said oscillator as a carrier frequency to said modulator to produce the modulated carrier frequency,
    a receiving circuit for selectively applying an output from said transducer in a receiving mode for receiving reflected signals to an input of said phase-locked-loop and
    a temperature responsive element arranged to control the voltage-controlled oscillator at a frequency matched to an inherent frequency of said transducer.

2. A circuit according to claim 1 wherein said transmitting circuit and said receiving circuit are alternately operated to establish the respective transmitting and receiving modes.

3. A circuit according to claim 1 wherein said temperature responsive element is a temperature responsive resistor.

4. A circuit according to claim 1 and further including a demodulator connected to an output of the phase-locked-loop.

5. A method for operating a transmitting/receiving circuit including the steps of
    producing a carrier frequency by a voltage-controlled oscillator having an input frequency controlled in accordance with a temperature dependency of an inherent frequency of an ultrasonic transducer, modulating the carrier frequency, applying the modulated carrier frequency in a transmitting mode to energize the ultrasonic transducer to produce ultrasonic transmission signal, switching from the transmitting mode to a receiving mode, applying output signals from the transducer representative of received ultrasonic signals to a phase-locked-loop circuit using the voltage-controlled oscillator whereby the phase-lock-loop circuit is automatically matched to a frequency of the received signals.

6. A method as set forth in claim 5 and including the further step of demodulating an output of the phase-locked-loop.

* * * * *